Nov. 6, 1956 L. J. MATTINGLY 2,769,869

NEUTRALIZED AMPLIFIER

Filed Dec. 2, 1954

INVENTOR.
Lawrence J. Mattingly
BY
Mueller & Aichele
Attys.

United States Patent Office 2,769,869

Patented Nov. 6, 1956

2,769,869

NEUTRALIZED AMPLIFIER

Lawrence J. Mattingly, Lombard, Ill., assignor to Motorola, Inc., Chicago, Ill., a corporation of Illinois Application December 2, 1954, Serial No. 472,599

4 Claims. (Cl. 179—171)

The present invention relates to wave signal receivers and more particularly to neutralized amplifier circuits for use in such receivers.

Difficulties have been encountered in providing suitably neutralized high-frequency amplifiers such as the intermediate-frequency amplifier of present day television receivers. It is usual in most present day television receivers to utilize 40 megacycles as the intermediate frequency, and it is desirable that the intermediate-frequency amplifier be neutralized so as to provide more gain, more stability, and to obtain consistent band-pass characteristics from one receiver to another. Neutralization of the intermediate-frequency amplifier is usually accomplished by a bridge circuit which utilizes as one arm of the bridge the screen by-pass capacitor of the discharge device of one of the intermediate-frequency amplifier stages. However, as will be discussed hereinafter, this type of neutralizing is not suitable when unity coupling circuits of the bifilar or other types are used.

It is, accordingly, an object of the present invention to provide an amplifier which is constructed to be suitably neutralized even when unity coupling is used between cascaded stages of the amplifier.

Another object of the invention is to provide such an improved neutralized amplifier that uses a minimum of components and which may be constructed cheaply and efficiently so as to make its inclusion in commercial receivers economically feasible.

A feature of the invention is the provision of an amplifier including a capacitor connected from the input circuit of one cascaded stage to the screen circuit of a preceding stage so that the screen by-passing capacitor of the preceding stage may be used effectively to neutralize the amplifier even with unity coupling between the stages.

The above and other features of the invention which are believed to be new are set forth with particularity in the appended claims. The invention itself, however, together with other objects and advantages thereof may best be understood by reference to the following description when taken in conjunction with the accompanying drawing in which:

Figures 1, 2A, 2B, 3A, 3B:
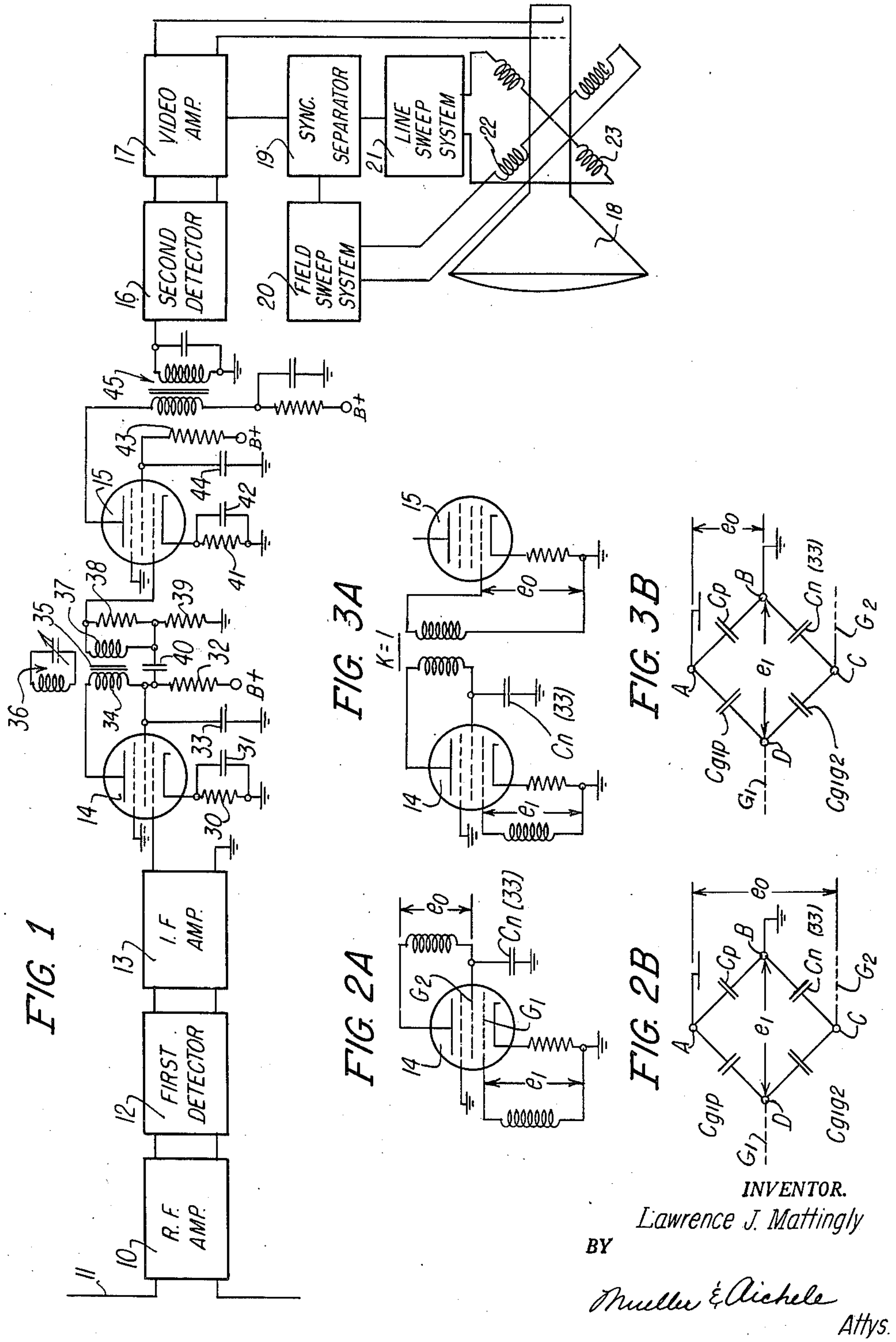
Fig. 1 is a television receiver including a neutralized intermediate-frequency amplifier constructed in accordance with the invention.
Figs. 2A and 2B are schematic representations of a known neutralizing circuit.
Figs. 3A and 3B are further schematic representations of known neutralizing circuits to illustrate how such circuits are ineffective when unity coupling is used between cascaded stages of the amplifier.

The present invention provides an amplifier which includes an electron discharge device having an anode, a cathode, a screen electrode and a control electrode. Means is provided for impressing an input signal on said control electrode, and further means connects the cathode to a point of reference potential. A coupling transformer has its primary winding connected between the anode and the screen electrode of the discharge device. A by-passing and neutralizing capacitor is connected from the screen electrode to the point of reference potential, and further means connects the screen to the positive terminal of a source of unidirectional potential. The secondary winding of the transformer is coupled to a utilization circuit, one side of the secondary is connected to the point of reference potential through an impedance element, and a capacitor is connected from the junction of the secondary winding and the impedance element to the screen of the discharge device so that the output signal appears across the neutralizing capacitor to allow neutralization to be effected in a manner to be described.

The receiver of Fig. 1 includes a radio frequency amplifier 10 having input terminals coupled to an antenna 11 and having output terminals coupled through a first detector 12 to the initial stages 13 of the intermediate frequency amplifier of the receiver. The intermediate frequency amplifier also includes a pair of cascaded stages which in turn, include respective electron discharge devices 14 and 15. Discharge device 15 is connected to constitute the final intermediate frequency amplifier stage and is coupled to the second detector 16 of the receiver. The second detector is coupled through a video amplifier 17 to a cathode ray picture tube or image reproducer 18. The video amplifier is also connected to a synchronizing signal-separator 19 which is coupled to a field or vertical sweep system 20 and to a line or horizontal sweep system 21. Field sweep system 20 is connected to the field or vertical deflection windings 22 of the reproducer 18 and the line sweep system is connected to the line or horizontal deflection windings 23 of the reproducer.

The operation of the television receiver is exceedingly well known, and need not be described in detail herein. Briefly, a television signal intercepted by antenna 11 is amplified in radio frequency amplifier 10 and heterodyned by first detector 12 to the selected intermediate frequency. The resulting intermediate frequency signal is amplified by the intermediate frequency amplifier, detected in second detector 16, amplified in video amplifier 17 and supplied to reproducer 18. The sychronizing components are separated from the composite video signal by synchronizing signal separator 19, and the field synchronizing components are used to synchronize the field sweep system 20 whereas the line synchronizing components are used to synchronize the line sweep system 21. In this manner, reproducer 18 is enabled to reproduce the televised information. The sound portion of the receiver forms no part of the invention and has not been shown.

Discharge device 14 has a control electrode which is coupled to the preceding intermediate frequency amplifier stage in any known manner. The device also has a cathode which is connected to a point of reference potential or ground through a cathode biasing resistor 30 which is shunted by a capacitor 31. The screen electrode of device 14 is connected to the positive terminal B+ of a source of unidirectional potential through a resistor 32 which is by-passed by a capacitor 33. The suppressor electrode of device 14 is connected to ground, and the anode is connected to the screen electrode through the primary winding 34 of a coupling transformer 35 which may be a unity coupling arrangement of the bifilar type. A resonant trap circuit 36 tuned to the intercarrier sound frequency may be inductively coupled to the primary winding of the transformer 35. The transformer has a secondary winding 37 having its upper side directly connected to the control electrode of device 15. The secondary winding is shunted by a damping resistor 38 and the lower side of the winding is connected to ground through an impedance element 39 which may, for example, be an inductance coil or a resistor. The junction of winding 37 and impedance element 39 is coupled through a capacitor 40 to the junction of winding 34 and resistor 32.

The cathode of device 15 is connected to ground through a cathode biasing resistor 41 which is by-passed by a capacitor 42. The screen electrode of this device is connected to the positive terminal B+ through a resistor 43 and is by-passed to ground by a capacitor 44. The anode of device 15 is connected to the positive terminal B+ through the primary winding of a transformer 45. One side of the secondary winding of transformer 45 is connected to second detector 16 and the other side of this winding is connected to the point of reference potential or ground.

As shown in Figs. 2A and 2B, it is usual to neutralize the amplifier stage of device 14 by using the screen by-passing capacitor 33 as a neutralizing capacitor. The circuit is connected so that capacitor 33 forms one arm of a bridge circuit. This bridge circuit includes a capacitor $C_p$ which represents the capacity between the plate and ground of device 14 and which extends between the points A and B of the bridge. The bridge also includes the capacity $C_{G1,P}$ which extends between the points A and D of the bridge, and which represents the capacity between the control electrode and the plate of device 14. The bridge also includes the capacity $C_{G1,G2}$ which extends between the points D and C of the bridge, and which represents the capacity between the control electrode and screen electrode of device 14. Finally, the bridge includes the capacity $C_N$ between the points C and B thereof, and which is the capacity of the screen by-passing capacitor 33.

For many coupling arrangements between the circuit of device 14 and that of the succeeding device 15, the output signal $e_0$ which produces feedback, can be considered as the voltage appearing across the primary winding of the coupling transformer. This voltage appears across the points A and C of the bridge, and its effect on the input signal $e_1$ impressed on the control electrode of device 14 can be neutralized by adjusting $C_N$ (capacitor 33) until the bridge shown in Fig. 2B is balanced. However, when unity coupling is used; the output signal $e_0$ producing feedback is no longer developed across the primary winding between the plate and screen of the device 14, but is effectively the voltage across the secondary which is developed between the plate and ground of device 14. This condition is shown in Figs. 3A and 3B. As shown in Fig. 3B, it can be seen that since the output signal $e_0$ appears across one of the arms of the bridge between points A and B, it is impossible to balance the bridge by an adjustment of $C_N$.

In accordance with the present invention, the impedance element 39 and capacitor 40 serve to return the lower side of secondary 37 to the neutralizing screen by-passing capacitor 33 rather than to ground. With this arrangement, the output signal appears between the points A and C of the bridge as in the case of Figs. 2A and 2B, so that the bridge may be balanced and neutralization may be achieved by the appropriate value of the screen by-passing capacitor 33.

In a constructed embodiment of the invention, the following values were used and these values are listed herein merely by way of example and are not intended to limit the invention in any way:

| | |
|---|---|
| Devices 14, 15 | 6CB6. |
| Resistor 38 | 22,000 ohms. |
| Resistor 39 | 1,200 ohms. |
| B+ | 150 volts. |
| Capacitor 33 | 560 micromicrofarads. |
| Capacitor 40 | 1000 micromicrofarads. |

It has been found that effective neutralization of the intermediate frequency amplifier is achieved by the disclosed circuit, and this is accomplished simply and expeditiously merely by the addition of a pair of relatively inexpensive components, namely resistor 39 and capacitor 40.

I claim:

1. An amplifier including in combination an electron discharge device having an anode, a cathode, and a plurality of intermediate electrodes between said anode and cathode; means for connecting said cathode to a point of reference potential; means for impressing an input signal on a first of said intermediate electrodes; a transformer having a primary winding connected between said anode and a second of said intermediate electrodes and further having a secondary winding; means connecting said second intermediate electrode to the positive terminal of a unidirectional potential source; first capacitor means connected from said second intermediate electrode to said point of reference potential for neutralizing and by-passing purposes; a load circuit coupled between one side of said secondary winding and said point of reference potential; impedance means connecting the other side of said secondary winding to said point of reference potential; and second capacitor means coupling said other side of said secondary winding to said second intermediate electrode so that the output signal from the amplifier which tends to produce feedback appears effectively across said primary winding, and said first capacitor means having a selected value so as to neutralize the effect of such output signal.

2. An amplifier including in combination an electron discharge device having an anode, a cathode, a control electrode and a screen electrode; means for connecting said cathode to a point of reference potential; means for impressing an input signal on said control electrode; a transformer having a primary winding connected between said anode and said screen electrode and further having a secondary winding; means connecting said screen electrode to the positive terminal of a unidirectional potential source; first capacitor means coupling said screen electrode to said point of reference potential for neutralizing and by-passing purposes; a load circuit coupled between one side of said secondary winding and said point of reference potential; resistor means connecting the other side of said secondary winding to said point of reference potential; and further capacitor means coupling said other side of said secondary winding to said screen electrode so that the output signal from the amplifier which tends to produce feedback appears effectively across said primary winding, and said first capacitor means having a selected value so as to neutralize the effect of said output signal.

3. An amplifier including in combination an electron discharge device having an anode, a cathode, a screen electrode, and a control electrode; means for impressing an input signal on said control electrode; means for connecting said cathode to a point of reference potential; a coupling transformer having a primary winding connected between said anode and said screen electrode and having a secondary winding; first capacitor means connected between said screen electrode and said point of reference potential; means connecting said screen electrode to the positive terminal of a source of unidirectional potential; means for connecting one side of said secondary winding to a first input terminal of a utilization circuit, the other input terminal of said utilization circuit being connected to said point of reference potential; impedance means connecting the other side of said secondary winding to said point of reference potential; and second capacitor means connecting the junction of said secondary winding and said impedance means to said screen electrode so that the output signal from the amplifier which tends to produce feedback appears effectively across said primary winding, and said first capacitor means having a selected value so as to neutralize the effect of such output signal.

4. An amplifier including in combination an electron discharge device having an anode, a cathode, a screen electrode and a control electrode; means for impressing an input signal on said control electrode; means for connecting said cathode to a point of reference potential; a coupling transformer having a primary winding connected between said anode and said screen electrode and having a secondary winding; first capacitor means connected between said screen electrode and said point of reference potential; resistor means connecting said screen electrode to the positive terminal of a source of unidirectional potential; a second electron discharge device having a cathode connected to said point of reference potential and having a control electrode connected to one side of said secondary winding; a resistor connecting the other side of said secondary winding to said point of reference potential; and second capacitor means coupling the junction of said secondary winding and said impedance means to said screen electrode so that the output signal from the amplifier which tends to produce feedback appears effectively across said primary winding, and said first capacitor means having a selected value so as to neutralize the effect of such output signal.

References Cited in the file of this patent

UNITED STATES PATENTS

| | | |
|---|---|---|
| 2,269,694 | Schade | Jan. 13, 1942 |
| 2,533,020 | Knol et al. | Dec. 5, 1950 |
| 2,664,469 | Moehring et al. | Dec. 29, 1953 |

OTHER REFERENCES

Publication, Radio Electronics, by Alan G. Sorensen, May 1953, issue 5, page 45, Figure 5.